US009723697B1

(12) United States Patent
Cheng et al.

(10) Patent No.: US 9,723,697 B1
(45) Date of Patent: Aug. 1, 2017

(54) SYSTEM FOR ALTERNATING LIGHT-EMITTING OF DYNAMIC RANDOM ACCESS MEMORY

(71) Applicant: ALSON TECHNOLOGY LIMITED, Kowloon OT (HK)

(72) Inventors: Han-Hung Cheng, Zhubei (TW); Chi-Fen Kuo, Zhubei (TW)

(73) Assignee: ALSON TECHNOLOGY LIMITED, Kowloon, Hong Kong (HK)

( * ) Notice: Subject to any disclaimer, the term of this patent is extended or adjusted under 35 U.S.C. 154(b) by 0 days.

(21) Appl. No.: 15/008,124

(22) Filed: Jan. 27, 2016

(51) Int. Cl.
*G11C 13/04* (2006.01)
*H05B 37/02* (2006.01)
*H05B 33/08* (2006.01)

(52) U.S. Cl.
CPC ..... *H05B 37/0272* (2013.01); *H05B 33/0845* (2013.01); *H05B 33/0857* (2013.01)

(58) Field of Classification Search
CPC ...... H05B 33/0857; G11C 11/42; G11C 19/30
See application file for complete search history.

(56) References Cited

U.S. PATENT DOCUMENTS 7,584,006 B2 * 9/2009 Paul ........................ G06F 1/206 700/299
2006/0045168 A1 * 3/2006 Socci ....................... G01K 7/42 374/163
2016/0205748 A1 * 7/2016 Lashina ............. H05B 33/0851 315/130
2016/0212825 A1 * 7/2016 Kuo .......................... G06F 3/06

FOREIGN PATENT DOCUMENTS

TW 201520737 A 6/2015

OTHER PUBLICATIONS

Crucial Ballistix Tactical Tracer Series Memory—Micron Tecnologies 2012.*

* cited by examiner

*Primary Examiner* — Jason M Crawford
(74) *Attorney, Agent, or Firm* — Muncy, Geissler, Olds & Lowe, P.C.

(57) ABSTRACT

A system for alternating lighting-emitting of dynamic random access memory (DRAM) is provided, including a plurality of DRAMs and an application program. Each DRAM includes a processing unit and a lighting-emitting unit. The processing unit is able to trigger the lighting-emitting unit to emit light in a preset mode. The lighting-emitting units define a lighting-emitting module. The application program is installed in a mobile electronic device. The application program sends a signal to the processing units of the DRAMs via the mobile electronic device to match with and identify the DRAMs, and the application program can make each said processing unit control the light-emitting unit to emit light and make the light-emitting module emit light in a preset mode.

8 Claims, 3 Drawing Sheets

SYSTEM FOR ALTERNATING LIGHT-EMITTING OF DYNAMIC RANDOM ACCESS MEMORY

BACKGROUND OF THE INVENTION

Field of the Invention

The present invention relates to a system for alternating light-emitting of dynamic random access memory (DRAM).

Description of the Prior Art

Usually, a dynamic random access memory (DRAM) as disclosed in TW201520737 has a substrate, a boosting circuit and a plasma tube. The boosting circuit is disposed on the substrate, and the boosting circuit is electrically connected with two power output ends. Two opposite ends of the plasma tube have two electrodes electrically connected with the two power output ends.

However, when this type of prior art is in actual practice, variation of the plasma tube or a light-emitting diode is monotonous and is not pleasant to the eye.

On the other hand, in the DRAM sold on the market, a frequency, a color and a mode of the light-emitting diode emitting light and flashing are fixed, and a user cannot adjust a light-emitting mode according to his/her needs or requirements.

The present invention has arisen to mitigate and/or obviate the afore-described disadvantages.

SUMMARY OF THE INVENTION

The major object of the present invention is to provide a system for alternating light-emitting of dynamic random access memory (DRAM), wherein an application program can be used to control a light-emitting mode of a DRAM to meet a user's requirements and preferences.

To achieve the above and other objects, a system for alternating light-emitting of DRAM is provided, including a plurality of DRAMs and an application program.

Each DRAM includes a processing unit and a light-emitting unit, the processing unit can trigger the light-emitting unit to emit light in a preset mode, the light-emitting units define a lighting-emitting module. The application program is installed in a mobile electronic device. The application program sends a signal to the processing units of the DRAMs via the mobile electronic device to match with and identify the DRAMs, and the application program can make each said processing unit control the light-emitting unit to emit light and make the light-emitting module emit light in a preset mode.

Thereby, the system of the present invention allows the user to control and design the light-emitting mode of the DRAM through mobile electronic device (for example, a smart phone) in accordance with his/her requirements or preferences.

The present invention will become more obvious from the following description when taken in connection with the accompanying drawings, which show, for purpose of illustrations only, the preferred embodiment(s) in accordance with the present invention.

DETAILED DESCRIPTION OF THE PREFERRED EMBODIMENTS

The present invention will be clearer from the following description when viewed together with the accompanying drawings, which show, for purpose of illustrations only, the preferred embodiment in accordance with the present invention.

Figure 1:
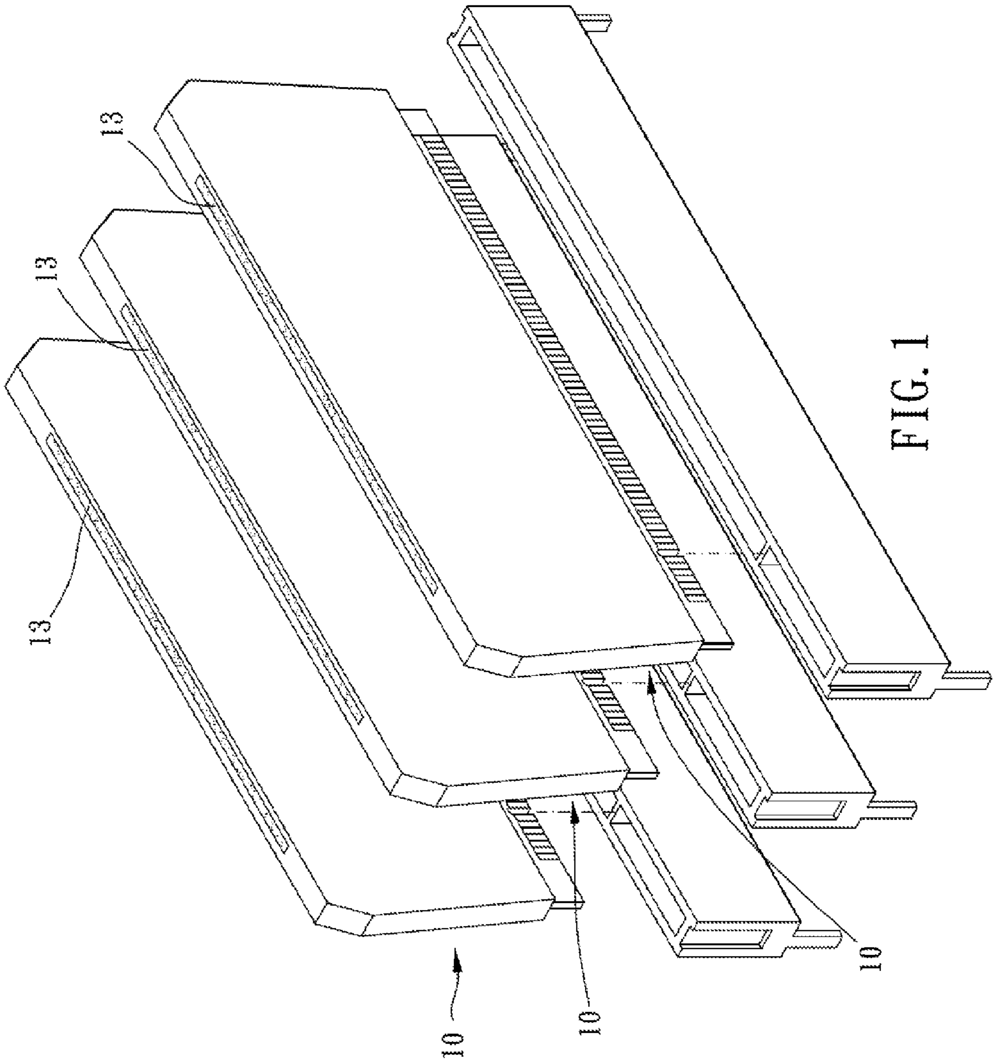
FIG. 1 is a perspective view of a dynamic random access memory of the present invention.
Figure 2:
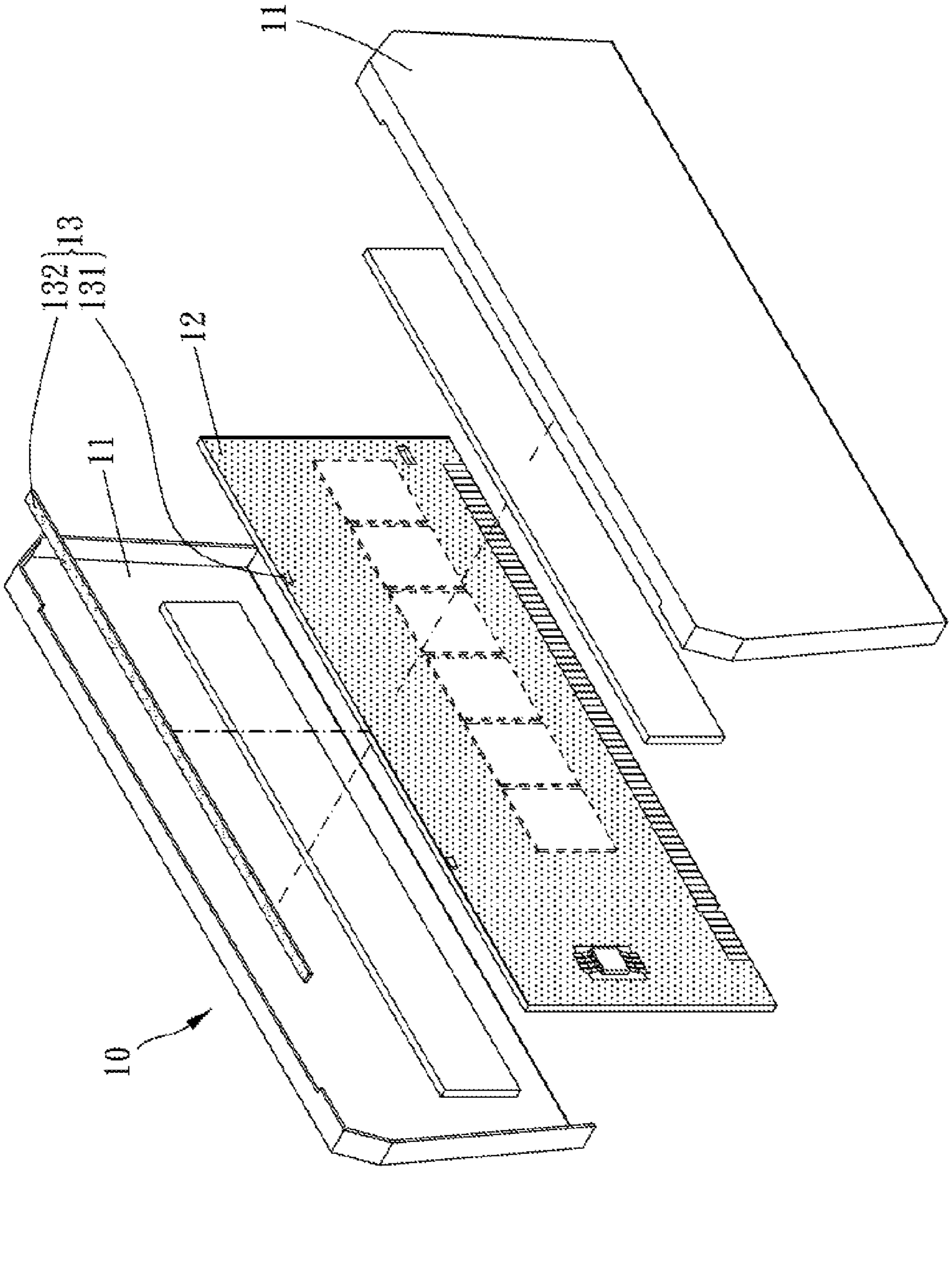
FIG. 2 is a perspective breakdown view of the dynamic random access memory of the present invention.
Figure 3:
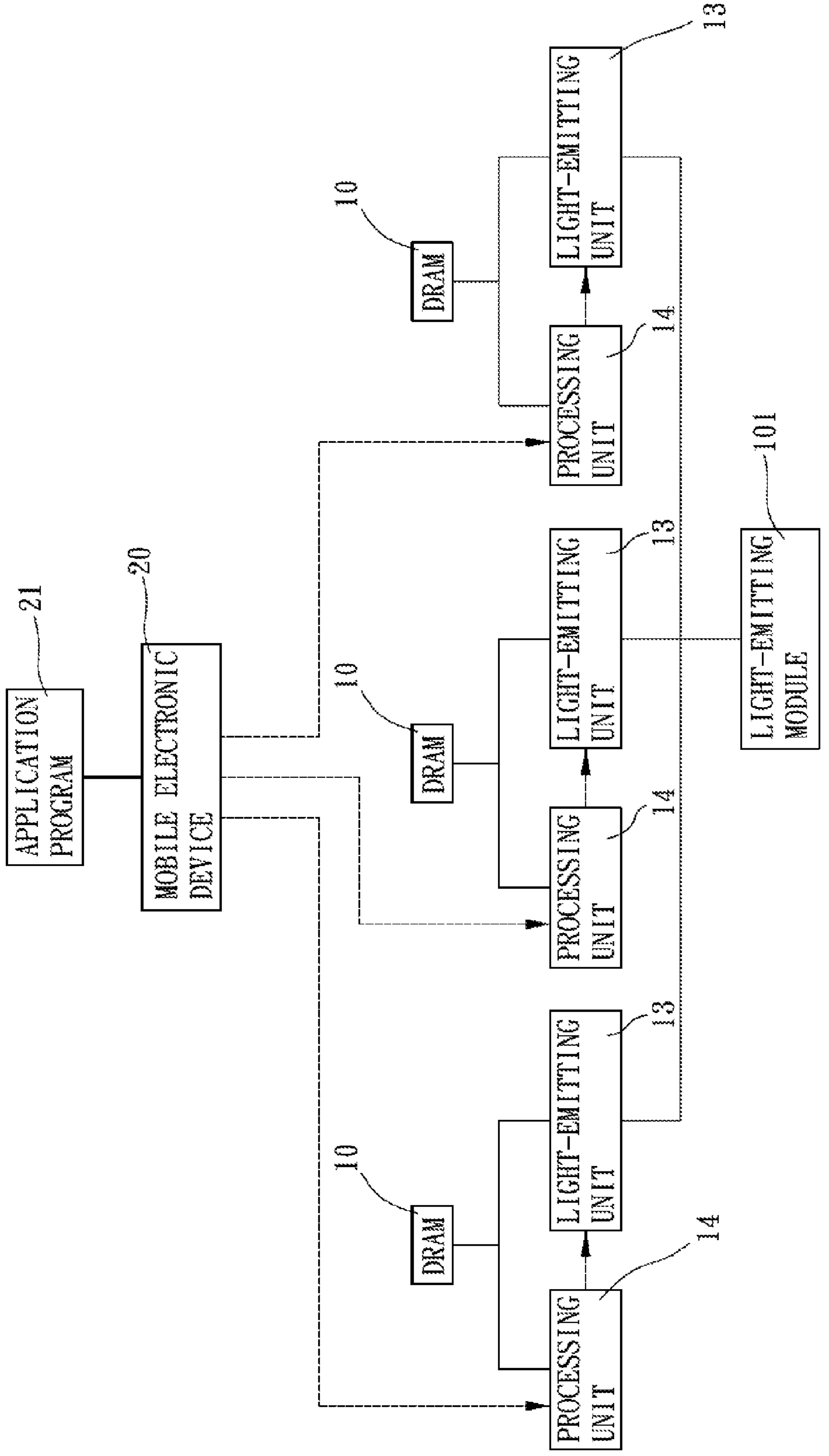
FIG. 3 is a sketch showing a system of the present invention.

Please refer to FIGS. 1 to 3 for a system for alternating light-emitting of dynamic random access memory (DRAM) of the present invention, including a plurality of DRAMs 10 and an application program 21.

Each DRAM 10 includes a shell body 11, a main body 12, a processing unit 14 and a light-emitting unit 13. The main body 12, the processing unit 14 and the light-emitting unit 13 are received in the shell body 11, and the processing unit 14 can trigger the light-emitting unit 13 to emit light in a preset mode. Specifically, the processing unit 14 of each said DRAM 10 can control a frequency, a color, a delay time and a flashing mode of light emitted from the light-emitting unit 13. Each said light-emitting unit 13 preferably includes at least one light-emitting diode 131, and more preferably, each said light-emitting unit 13 further includes at least one light-guiding member 132. The light-guiding member 132 is arranged neighboring to the light-emitting diode 131 and partially exposed so as to transmit light from the light-emitting diode 131 through the light-guiding member 132. Preferably, each said light-emitting unit 13 includes a plurality of light-emitting diodes 131, the light-emitting diodes 131 have different colors in emitting light, and the light-emitting units 13 define a light-emitting module 101. Preferably, the light-emitting units 13 are neighboring to each other. In addition, each DRAM 10 may have connection ports which are commonly used. The application program 21 is installed in a mobile electronic device 20, the application program 21 can send out a signal through the mobile electronic device 20 to the processing units 14 of the DRAMs 10 to match with and identify the DRAMs 10 and make each said processing unit 14 control the light-emitting unit 13 to emit light and make the light-emitting module 101 emit light in the preset mode. Preferably, after each said processing unit 14 receives the signal from the mobile electronic device 20, the processing unit 14 triggers the light-emitting unit 13 to emit light in the preset mode circularly.

In actual practice, the user can purchase and assemble the DRAMs 10 at will, and the processing unit 14 of each said DRAM 10 can be built in with some specific light-emitting modes or set with various elements to be assembled (for example, each light-emitting duration time, an interval time between two light-emissions, light colors, a light-emitting intensity, a flashing frequency, and a delay time of light-emission). When the DRAMs 10 are installed, the user can send a signal to the processing unit 14 (the processing unit 14 needs to be a device which can receive the signal, for example, a Bluetooth receiver or an infrared receiver) of the DRAM 10 through wireless or remote communications (for example, Bluetooth communication or infrared communication) via the application program 21 (the application program 21 can be manufactured by a manufacturer of the DRAM to be provided to the user) installed in the mobile electronic device 20 (for example, a smart cell phone or a tablet computer) so as to trigger the processing unit 14 to control the light-emitting mode of the light-emitting unit 13.

More specifically, the application program 21 provides a simple interface to let the user choose one of the preset specific light-emitting modes. For example, suppose that the application program detecting three DRAMs, the interface shows that there are three DRAMs available for carrying out the light-emitting modes; and suppose that the user choosing the mode in which the three light-emitting units each flash three times per second, in turn, without the interval time and circularly. Actually, the application program sends a first one of the three DRAMs a control signal which means zero delay time, flash three times per second and 2-second interval time between two light-emissions; the application program sends a second one of the three DRAMs a control signal which means 1-second delay time, flash three times per second, 2-second interval time between two light-emissions; and the application program sends a third one of the three DRAMs a control signal which means 2-second delay time, flash three times a second, 2-second interval time between two light-emissions. As a result, a light-emitting set of the three light-emitting units allows the light-emitting module to emit light in a specific mode.

The above description describes how the application program controls the light-emitting module to emit light in the preset mode; however, the light-emitting mode is not limited thereto. The application program may provide a customized interface to allow the user to design specific light-emitting modes and even a coloring interface to allow the user to control colors of light emitted from the light-emitting unit (different colors of the light-emitting diodes are controlled to emit light or not). The application program may even have additional functions, for example, to adjust the light-emitting patters through voice control.

Given the above, the system for alternating light-emitting of dynamic random access memory allows the user to adjust the light-emitting mode of the light-emitting module. As a number of the DRAM varies, various light-emitting modes can be provided, and the user can design the light-emitting modes and colors at will.

While we have shown and described various embodiments in accordance with the present invention, it should be clear to those skilled in the art that further embodiments may be made without departing from the scope of the present invention.

What is claimed is:

1. A system for alternating light-emitting of dynamic random access memory (DRAM), including:

a plurality of DRAMs, each DRAM including a processing unit and a light-emitting unit, the processing unit being able to trigger the light-emitting unit to emit light in a preset mode, the light-emitting units defining a light-emitting module; and a mobile electronic device, an application program being installed in the mobile electronic device, the application program sending a signal via the mobile electronic device to the processing units of the DRAMs so as to match with and identify the DRAMs, to make each said processing unit control the light-emitting unit to emit light and to make the light-emitting module to emit light in a preset mode;

wherein the processing unit of each said DRAM is able to control a frequency, a color, a delay time and a flashing mode of light emitted from the light-emitting unit.

2. The system for alternating light-emitting of DRAM of claim 1, wherein the light-emitting units are neighboring to each other.

3. The system for alternating light-emitting of DRAM of claim 1, wherein each said light-emitting unit includes at least one light-emitting diode.

4. The system for alternating light-emitting of DRAM of claim 3, wherein each said light-emitting unit further includes at least one light-guiding member, and the light-guiding member is located neighboring to the light-emitting diode and partially exposed so as to allow light from the light-emitting diode to transmit from the light-guiding member.

5. The system for alternating light-emitting of DRAM of claim 3, wherein each said light-emitting unit includes a plurality of light-emitting diodes, the light-emitting diodes have different colors in emitting light.

6. The system for alternating light-emitting of DRAM of claim 1, wherein after each said processing unit receives the signal from the mobile electronic device, the processing unit makes the light-emitting unit emit light in the preset mode repeatedly.

7. The system for alternating light-emitting of DRAM of claim 1, wherein the processing unit contacts with the mobile electronic device through Bluetooth communication.

8. The system for alternating light-emitting of DRAM of claim 1, wherein the processing unit contacts with the mobile electronic device through infrared communication.

* * * * *